(12) United States Patent
Matsuba et al.

(10) Patent No.: US 6,486,393 B1
(45) Date of Patent: Nov. 26, 2002

(54) MAGNETICALLY SHIELDING STRUCTURE

(75) Inventors: Hironori Matsuba; Daiichi Irisawa; Akihito Yahara, all of Kanagawa (JP)

(73) Assignee: Furukawa Denki Kogyo Kabushiki Kaisha, Tokyo (JP)

(*) Notice: Subject to any disclaimer, the term of this patent is extended or adjusted under 35 U.S.C. 154(b) by 0 days.

(21) Appl. No.: 08/308,474

(22) Filed: Sep. 19, 1994

Related U.S. Application Data

(63) Continuation of application No. 07/853,721, filed as application No. PCT/JP91/01279 on Sep. 26, 1991, now abandoned.

(30) Foreign Application Priority Data

| Oct. 3, 1990 | (JP) | 2-263843 |
| Mar. 20, 1991 | (JP) | 3-080464 |
| Sep. 28, 1991 | (JP) | 2-257189 |

(51) Int. Cl.$^7$ ................................. H05K 9/00
(52) U.S. Cl. ............... 174/35 R; 174/35 C; 174/35 TS; 505/872
(58) Field of Search ................ 174/125.1, 35 R, 174/35 C, 35 SM, 35 MS, 35 TS; 505/872, 885

(56) References Cited

U.S. PATENT DOCUMENTS

| 2,721,995 A | * 10/1955 | Friend ................ 174/35 MS |
| 3,361,940 A | * 1/1968 | Culver et al. ............ 505/872 X |
| 5,466,885 A | * 11/1995 | Irisawa ................ 174/35 MS |

FOREIGN PATENT DOCUMENTS

| JP | 58-148499 | 9/1983 | |
| JP | 59-90997 | 5/1984 | |
| JP | 0313900 | * 12/1988 | ................ 505/885 |
| JP | 0253690 | * 10/1989 | |
| JP | 3-197897 | 8/1991 | |

* cited by examiner

*Primary Examiner*—Albert W. Paladini
(74) *Attorney, Agent, or Firm*—Crowell & Moring, LLP

(57) ABSTRACT

By combining magnetically shielding members of various different properties with each other, a magnetically shielding capability of a magnetically shielding structure is made to improve and a greatly reduced magnetic field, as compared to an external one, can be realized effectively. The penetrating magnetic field has a distribution, on the longitudinal axis of a cylindrical shielding body made of a material manifesting a Meissner effect, which attenuates toward the center direction of the cylindrical shielding body. Magnetic induction is generated in a cylindrical collar made of a highly permeable material. Then, the penetrating magnetic field is shorted magnetically, being absorbed by the highly permeable material. To make this possible, the cylindrical collar, made of a highly permeable material, which has an opening along the longitudinal direction of the cylindrical shielding body, is provided, leaving a space between the cylindrical shielding body made of the superconductive material manifesting the Meissner effect and itself.

6 Claims, 8 Drawing Sheets

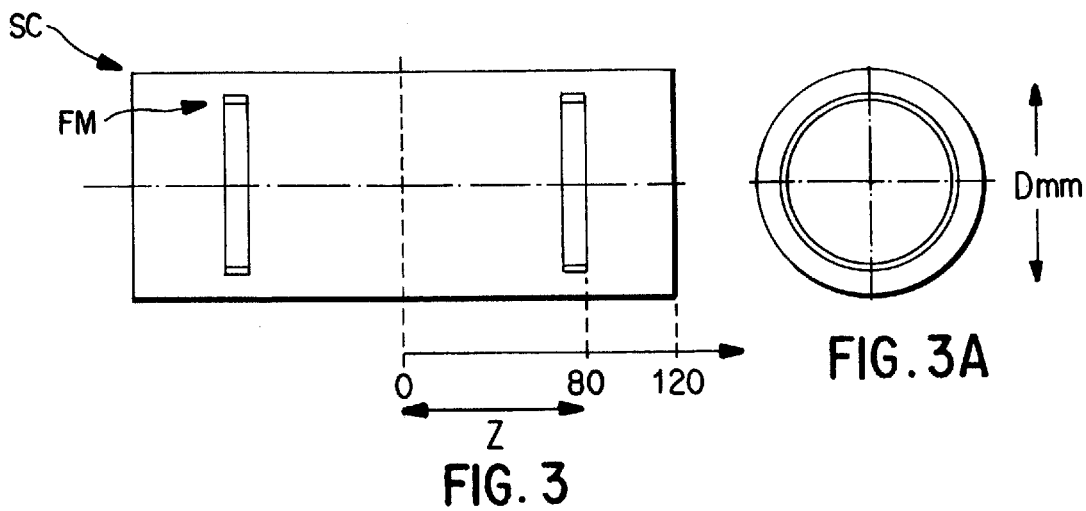
FIG. 3
FIG. 3A
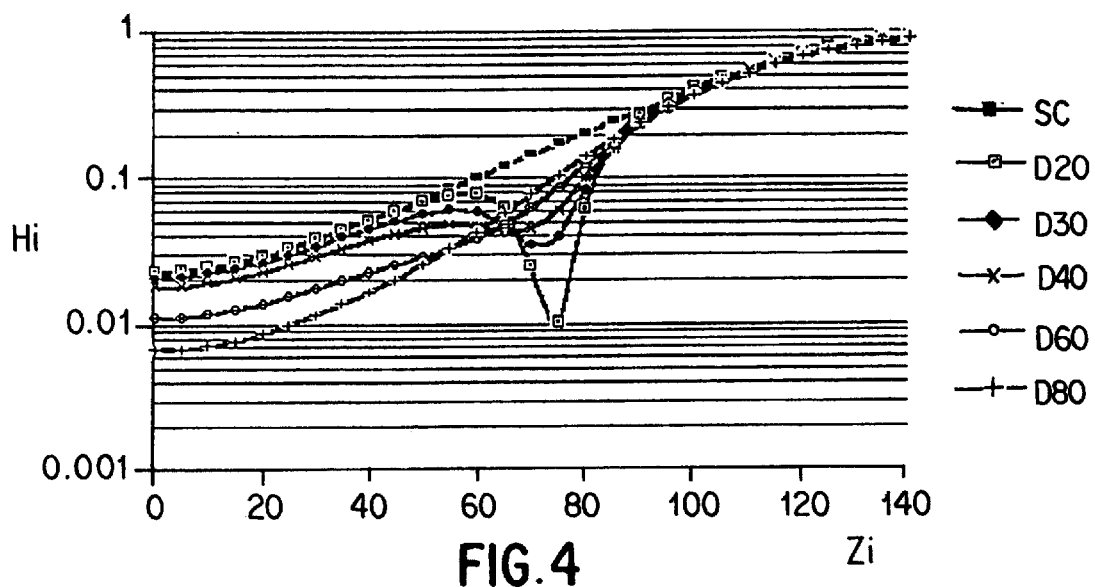
FIG. 4
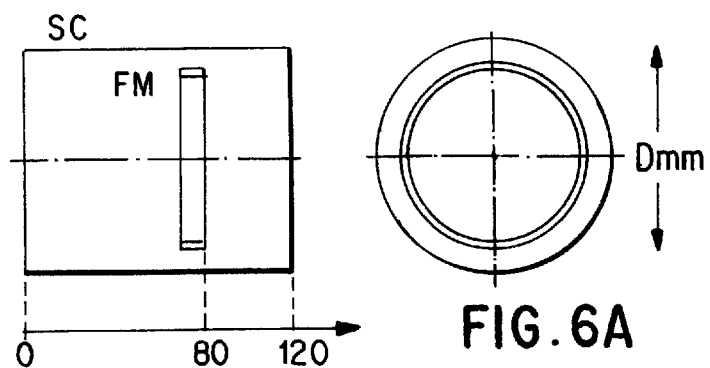
FIG. 6
FIG. 6A

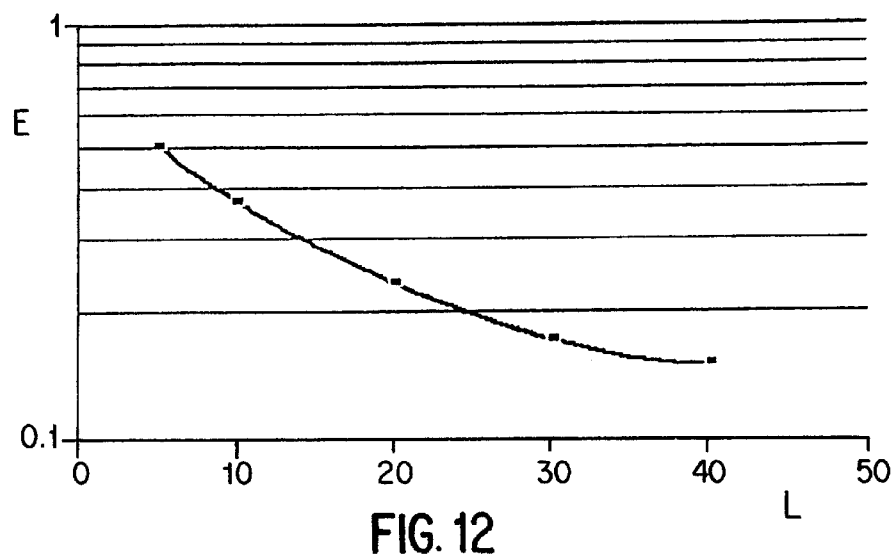
FIG. 12
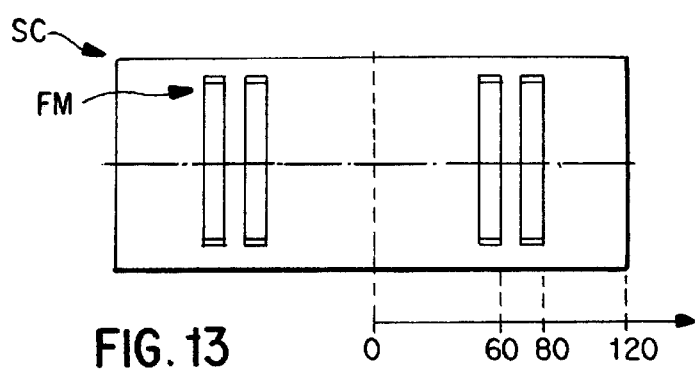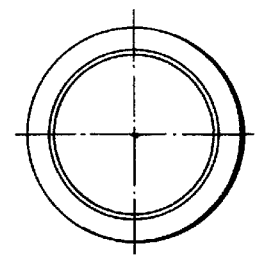
FIG. 13        FIG. 13A
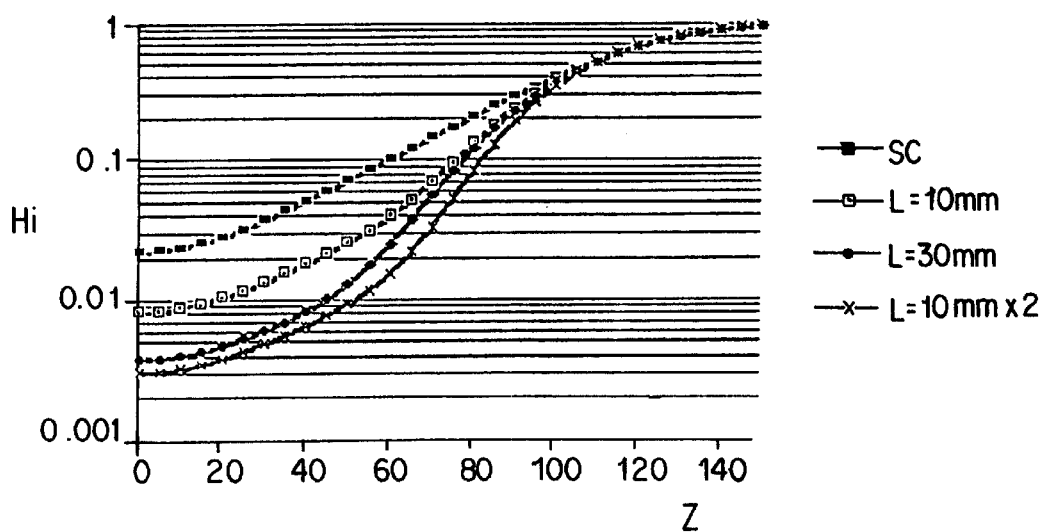
FIG. 14

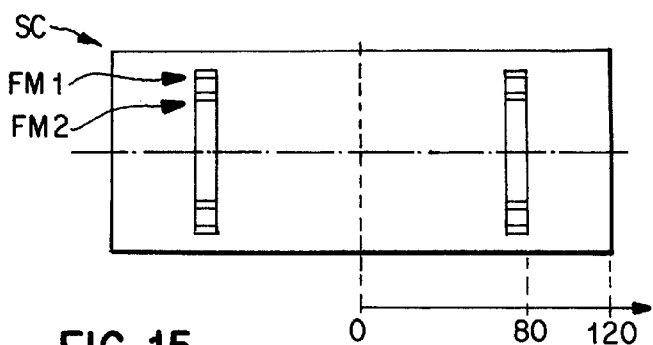
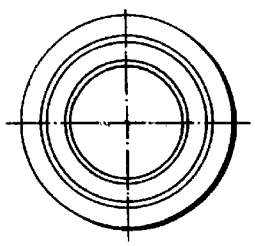
FIG.15  FIG.15A
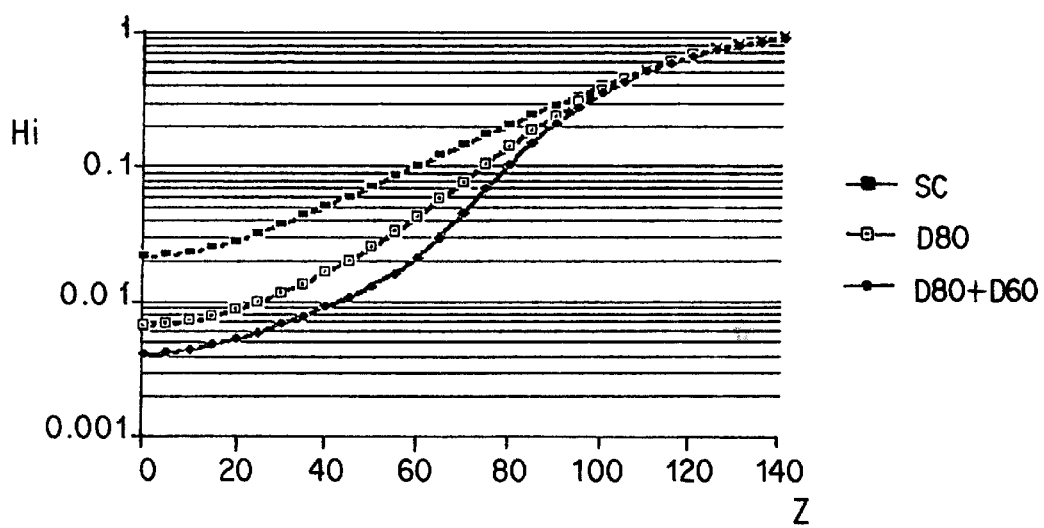
FIG.16
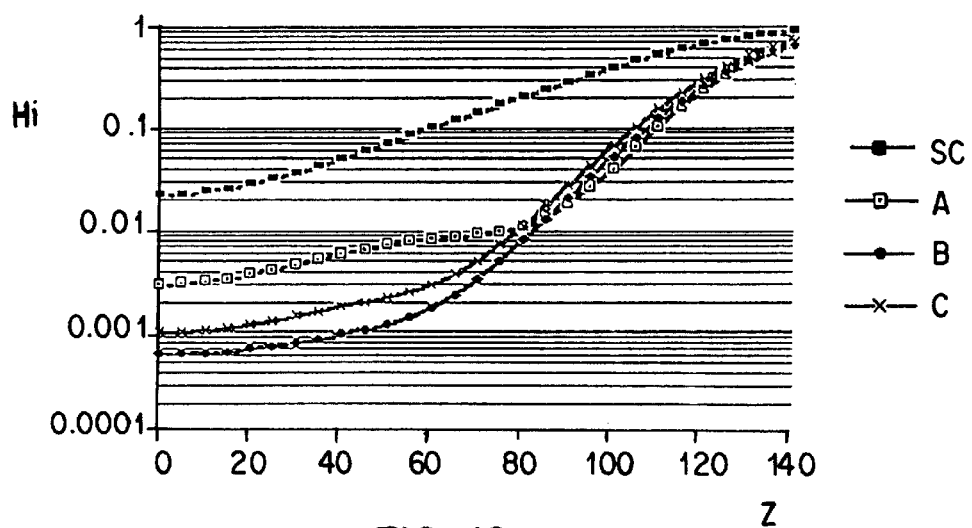
FIG.18

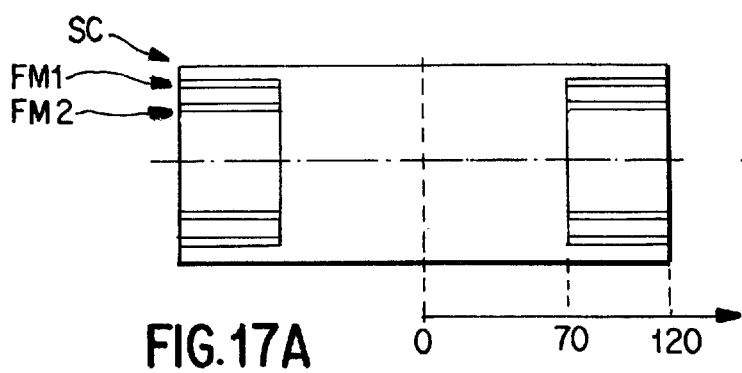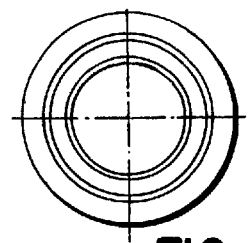
FIG. 17A    FIG.17A1
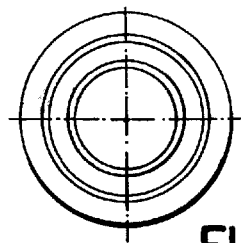
FIG. 17B    FIG.17B1
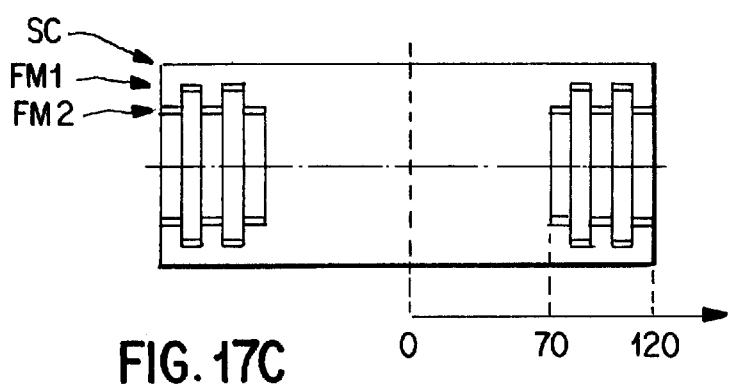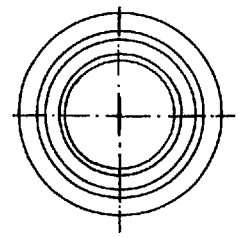
FIG. 17C    FIG.17C1

MAGNETICALLY SHIELDING STRUCTURE

This is a continuation of application Ser. No. 07/853,721, filed May 28, 1992 now abandoned, which is the National Phase of International Appln. PCT/JP91/01279, filed Sep. 26, 1991.

TECHNICAL FIELD

The present invention relates to a magnetically shielding structure utilizing a superconductor cylinder and, in particular, it relates to a magnetically shielding structure in which magnetically shielding capability is made to improve by combining magnetically shielding materials of various different properties and in which a penetrating magnetic field from the opening portion of the superconductor cylinder is reduced to a very small value, the volume of a usable highly magnetically shielded space inside the cylinder bore is increased, or a very feeble magnetic field can be realized in the cylinder bore even in the case of a short superconductor cylinder. Thereby, a much feebler magnetic field than an external one can be effectively realized in the cylinder bore.

BACKGROUND ART

In a magnetically shielding structure constructed by a superconductor, the Meissner effect is utilized for the magnetic shield. That is, a material having the Meissner effect is, for example, formed into a cylinder shape to form a shielding body and is cooled below the critical temperature Tc for the transition to a superconductive state for making the shielding body a diamagnetic and, thereby, a magnetic flux is forced out to the exterior of the shielding body, and the internal space of the shielding body is magnetically shielded.

On the other hand, in the case of a shielding structure with a highly permeable material being commonly used without utilizing a superconductor, where a shielding body is formed into a cylinder with the highly permeable material, for example, and if the shielding body is held in a magnetic field, magnetic induction is generated in the wall of the shielding body and the magnetic field is short-circuited along the shielding body. The internal bore space of the cylinder is magnetically shielded thereby.

In such a magnetically shielding structure utilizing a superconductor, although the magnetically shielding capability of a cylindrical shielding body, for example, is high enough for a magnetic field parallel to the center axis of the cylinder (longitudinal magnetic field), the magnetically shielding capability for a magnetic field perpendicular to the center axis (lateral magnetic field) is not enough. Therefore, there is a problem in that the length of the cylinder has to be long in comparison with the inner diameter of the cylinder.

On the other hand, in the case of a cylindrical shielding body formed with a highly permeable material, for example, the shielding capability for longitudinal magnetic field is not enough in comparison with that for lateral magnetic field. Also, because of the limited value of permeability, the shielding efficiency of a single-layer cylinder can not be high enough, so that, for obtaining high shielding capability, a plurality of cylinder walls have to be laminated and a structure in which the inner layer is shorter than the outer layer has to be adopted. As a result, even in the case of a highly permeable material being used, there has been a problem in that the length of a cylinder outer layer becomes long. When a usable space is to be larger, the dimensions in the radial dirction and also in the axial direction have to be large, which causes a problem in that the shielding body becomes expensive.

DISCLOSURE OF INVENTION

The present invention is invented considering various aspects as described above, and the object of the invention is to provide a magnetically shielding structure in which the shielding capability is improved by combining magnetically shielding materials of various different properties. A volume of a highly usable magnetically shielded space is increased by suppressing a penetrating magnetic field through the opening portion of a superconductor cylinder to be at a low value. Alternatively, an extremely feeble magnetic field can be realized in a specified space in the cylinder even in the case of a short superconductor cylinder. Thereby an extremely feeble magnetic field can be efficiently realized in comparison with an external magnetic field.

According to the present invention, the above-mentioned object can be solved with a magnetically shielding structure having the features as described in each of the claims.

In a magnetically shielding structure according to the present invention, against a penetrating magnetic field, which shows an attenuating distribution toward the center on the longitudinal axis of a cylindrical shielding body composed of a material manifesting the Meissner effect, a wide variety of combinations of the cylindrical magnetic shielding body composed of a superconductive material, which manifests the Meissner effect, and a cylindrical collar means made of a highly permeable material having a through opening along the longitudinal direction of the cylindrical magnetic shielding body are disposed for absorbing and magnetically shorting the penetrating magnetic field by the magnetic induction generated in the highly permeable material.

FIG. 20 shows a schematic diagram of a penetrating magnetic vector inside a superconductor cylinder when a lateral magnetic field is applied to the superconductor cylinder. A penetrating magnetic field being thus distributed is attenuated to decrease the penetration quantity coming into the inside of the superconductor cylinder by utilizing a property of a highly permeable member, called magnetic induction, which magnetically shorts the penetrating magnetic field. Since a highly permeable member may have a residual magnetic field, it has to be disposed in a position where the residual magnetic field does not exert its magnetic influence on the objective space of a feeble magnetic field.

FIG. 1 is an illustrative representation showing the constitution of an ordinary embodiment of the present invention. In the figure, there is shown an end portion of a cylindrical shielding body (1) composed of an oxide superconductive material. The length of the shielding body (1) is generally required to be in a range of 2 times to 20 times the sectional diameter of the cylinder. The range, however, can be changed according to the size of a shielded space or to the intensity of a magnetic field inside the space. In the figure, a sectional view is shown in which a large diameter ferromagnetic cylindrical collar (2) and a small diameter ferromagnetic cylinderical collar(3) are disposed in the opening portion of the cylindrical magnetically shielding body (1) in a coaxial manner for the prevention of magnetic penetration. In the figure, there are shown a space $G_1$ and a distance $d_1$ between the magnetically shielding body (1) and the large diameter ferromagnetic cylindrical collar (2), a space $G_2$, and a distance $d_2$, between the large diameter ferromagnetic cylindrical collar (2) and the small diameter ferromagnetic cylindrical collar (3), and an internal space $G_3$ of the small diameter ferromagnetic cylindrical collar (3) and a distance of radius R3 from the wall of the small diameter cylindrical collar (3) to the center axis. A part denoted with the numeral (4) is a magnetic field sensor placed in an objective feeble magnetic field space.

In the case where the superconductor cylinder (1) is applied alone, a penetrating magnetic field from the opening portion is expressed by following equations (I) and (II).

| | | |
|---|---|---|
| $Ht = 10^{-Kt' \cdot Z/R1}$ | $(Kt' = 0.79)$ | ------(I) |
| $Ha = 10^{-Ka' \cdot Z/R1}$ | $(Ka' = 1.66)$ | ------(II) |

Equation (I) expresses the magnetic field intensity Ht when an external magnetic field is applied to the cylinder in the direction perpendicular to the cylinder axis (lateral magnetic field), and Equation (II) expresses the magnetic field intensity Ha when an external magnetic field is applied to the cylinder in the direction parallel to the cylinder axis (longitudinal magnetic field). R1 is the radius of the superconductor cylinder and Z is the distance from the opening end of the cylinder. From the above equations, it is known that the quantity of a penetrating magnetic field is larger when the external magnetic field is applied to the cylinder in the direction perpendicular to the cylinder axis, and when the quantity is to be reduced, for example, to $10^{-8}$ times the external magnetic field, the objective space has to be positioned in the cylinder at a distance of 10 times the radius of the cylinder from the opening end portion. In other words, the length of the cylinder requires ten times the radius of the cylinder.

In the magnetically shielding structures according to preferred embodiment of the present invention, there are a mode in which cylindrical collar means made of a highly permeable material is disposed in the position within the range from the center portion to the end portion of the superconductor cylinder or disposed in the vicinity of the end portion of the cylinder body, a mode in which a plurality of cylindrical collar means of a highly permeable material are arranged in the longitudinal direction in the vicinity of the end portion, a mode in which a plurality of cylindrical collar means of a highly permeable material are disposed in multiple coaxial manner in the radial direction, etc. In the case, in particular, where a plurality of collars of a highly permeable material are arranged in the radial and/or longitudinal directions leaving spaces and/or intervals in multiple layers and/or in lamination, a magnetic field penetrating into the cylindrical superconductor shielding body can be decreased better than in the case where the single collar of a highly permeable material is used. The cylindrical collar of a highly permeable material of any shape can be used, so far as the collar can be inserted into the cylindrical shielding body of a superconductive material, and magnetic induction can be generated in the collar of a high permeability material and the penetrating magnetic field is absorbed in the highly permeable material and is magnetically shorted. The coller is, to be concrete, of a double open end type having a long cylinder length in comparison with the thickness. The shape can be a circle, an ellipse or a polygon. The collar can also be formed as a tapered cylindrical collar in which the inner diameter decreases with the increase in the distance from an end portion in the longitudinal direction or a cylindrical collar in which the shape of an inner cross section differs from that of an outer cross section having uneven places on the outer or inner surface. The shielding cylinder body can be formed as a cylindrical body in which the inner portion has a larger diameter in comparison with that of the end portion, a bellows-shaped cylindrical body, a cylinder of an L type, a T type, an H type, a cross type, a U type, or their combinations.

The ratio of the outer diameter of the collar of the highly permeable material to the inner diameter of a cylindrical shielding body composed of the superconductive material is shown in embodiments to be described later. When the collar of the high permeability material is used as a single piece and the collar having the outer diameter of more than ⅕ the inner diameter of the cylindrical shielding body is disposed inside the-superconductor cylinder body, a better shielding effect can be obtained than that when a superconductor cylinder is used alone. To be more precise, in order to shorten the length of the cylindrical shielding body, a method for calculating the attenuating quantity of a magnetic field penetrating through the gap between the superconductive body and the ferromagnetic collar is elucidated and the present invention is based on the result.

FIG. 2 is a diagram showing the calculation result of an attenuating quantity of a magnetic field penetrating through the gap between the superconductor body and the ferromagnetic collar. In the figure, the ordinate shows the K value of the exponent "exp(–Kz/d) or K' value of "$10^{-K' \cdot z/d}$", and the abscissa shows a relative diameter D of an inner cylindrical member, assuming that the diameter of an outer cylindrical member is 1, or the gap g between the inner and the outer cylindrical member. MSt denotes a magnetic field attenuation constant in the gap between cylindrical members for an external magnetic field (t) perpendicular to the cylinder axes of inside cylindrical ferromagnetic member (M) and the outside cylindrical superconductive member (S), and SMa denotes a magnetic field attenuation constant in the gap between both cylindrical members for an external magnetic field (a) in the direction of the axes of the inside cylindrical superconductive member (S) and the outside cylindrical ferromagnetic member (M).

In FIG. 1, G1 is a gap between the ferromagnetic member and the superconductive member. From FIG. 2, when d1<0.5R1, the attenuation of a magnetic field in the gap G1 is approximately

| | |
|---|---|
| $Ht = 10^{-Kt' \cdot Z/d1}$ | $Kt' = 0.65$ |
| $Ha = 10^{-Ka' \cdot Z/d1}$ | $Ka' = 0.62.$ |

When d2<0.5R2, the attenuation of a magnetic field in the gap G2 is approximately $Kt'=Ka'=1.36.$ The attenuation of a magnetic field in the gap G3 is approximately

| | |
|---|---|
| $Ht = 10^{-Kt' \cdot Z/R3}$ | $Kt' = 3.8$ |
| $Ha = 10^{-Ka' \cdot Z/R3}$ | $Ka' = 2.4.$ |

When the diameter of the ferromagnetic cylindrical member is so designed that the magnetic fields penetrating into these three gaps are made equal to each other at an exit portion, that is, at Z=L, it is an optimum design for making the penetrating magnetic field a minimum. Therefore, the following relations, $0.62/d1=1.36/d2=2.4/R3$ can be obtained. From these relations, $$R2=0.860R1$$

and $$R3=0.548R1$$

can be obtained, and the magnetic field at the exit portion at the length L is as follows $$H=10^{-2.4\ L/R3}=10^{-4.38\ L/R3}$$

The above value is remarkably improved in comparison with the value $$H=10^{-1.83\ L/R3}$$

which is obtained when the single superconductor cylinder body used alone. From the comparison of these equations, it is understood that the same attenuation quantity of magnetic fields can be obtained when the ratio between the lengths of cylindrical members is 1/5.54. In the above case, two sets of ferromagnetic collars are used, and when n sets of them are used the radii and gaps are $$Rp=[3.76+1.36(n-p)]R1/(1.66+1.36\ n),$$

$$d1=0.62R1/(1.66+1.36n)$$

and $$dp=1.36\ R1/(1.66+1.36n).$$

The attenuation of a magnetic field in this case is $$H=10^{-(1.66+1.36\ n)\ L/R1}$$

When n is increased, the attenuation quantity of a magnetic field can be made large. There is, however, a limit because of the distances between them.

The clearance between the superconductive member and the ferromagnetic member is, in particular, limited because cooling is needed for the superconductive member.

In general, when a uniform lateral magnetic field Ho is applied to a single cylinder of a high permeability material having an infinite length, the internal magnetic field Hi is $$Hi=2rHo/\mu t \quad \text{(III)}$$

where $\mu$ is permeability, t a thickness and r a radius, thus the attenuation quantity of a magnetic field has a finite value. In a feeble magnetic field, permeability of a ferromagnetic member is much decreased and the quantity of attenuation of a magnetic field by a ferromagnetic member is limited. The practical limit of attenuation is in the order of $10^{-5}$. The value of n is decided in consideration of these points.

As described in the above, according to the present invention, against a penetrating magnetic field which shows an attenuating distribution toward the center on the longitudinal axis of a cylindrical shielding body composed of a material manifesting the Meissner effect, magnetic induction is generated in a cylindrical collar means of a highly permeable material, and, as a result, a penetrating magnetic field is absorbed in the highly permeable material and is magnetically shorted, resulting in further decrease in the magnetic field penetrating into the inside of the cylindrical shielding body of the superconductive material.

There are, to be concrete, shielding structures in which a cylindrical collar means of a highly permeable material is disposed inside a superconductor cylinder body or in the vicinity of the end portion of the body, a plurality of cylindrical collars of the highly permeable material are arranged in the longitudinal direction in the vicinity of the end portion, or a plurality of cylindrical collars of the highly permeable material are arranged in a coaxial manner in the radial direction. In particular, the shielding structures in which a plurality of cylindrical collars of a highly permeable material are arranged in the radial direction and/or longitudinal direction leaving spaces and/or intervals in multiple layer and/or in lamination, can better decrease a magnetic field penetrating into the inside of a cylindrical superconductor shielding body than those in which a single collar of a highly permeable cylinder is used. By adopting the shapes and dispositions as described in the above, a shielding effect, which is not possible to obtain with a shielding cylinder body alone, can be obtained a volume of a usable space of a feeble magnetic field intensity can be increased, and the length of the cylindrical superconductor shielding body for obtaining an objective magnetically shielded space or a space of feeble magnetic field intensity can be shortened, which makes it possible to decrease the cost of a shielding equipment.

The above and other features and advantages of the present invention will be made clearer in the explanations of the embodiments referring to the accompanying drawings, which are not intended to limit the scope of the present invention.

BRIEF DESCRIPTION OF THE DRAWINGS

FIG. 3 is a schematic sectional view of another embodiment of the invention in which a double open end type superconcuctor cylinder body is provided with a pair of cylindrical collars of a highly permeable material having a diameter D to be varied;

FIG. 4 is a diagram showing an internal magnetic field distribution Hi on the axis of a superconductor cylinder body when the outer diameter D of a collar of a highly permeable material is varied;

FIG. 6 is a schematic sectional view in which a collar of a highly permeable material is disposed in a superconductor cylinder body of a single open end type;

FIG. 12 is a diagram showing the relation between the length L of the ccollar of a highly permeable material and the shielding effect;

FIG. 13 is a schematic sectional view in which two pairs of the collars of a highly permeable material are disposed in a row in the longitudinal direction of a superconductor cylinder body;

FIG. 14 is a diagram showing the internal magnetic field distribution on the axis of a superconductor cylinder when two pairs of collars of a highly permeable material are disposed in the row in the longitudinal direction;

FIG. 15 is a schematic sectional view in which two pairs of coaxial collar arrangements of a highly permeable material are disposed in a superconductor cylinder body;

FIG. 16 is a diagram showing the internal magnetic field distribution on the axis of a superconductor cylinder when the two pairs of tha coaxial collar arrangements of a highly permeable material are disposed in the cylinder body;

FIGS. 17A, 17B and 17C are schematic sectional views in which a plurality of collars of a highly permeable material are arranged in the radial direction and the longitudinal direction in multiple layers and in lamination, in which FIG. 17A1 is a schematic sectional view in which two long collars of a highly permeable material are disposed in multiple layers in the radial direction to form each of the pairs, FIG. 17B1 is a schematic sectional view of a constitution in which two pairs of collar arrangements are constituted with three sets of two coaxial collars aranged in the longitudinal direction, and FIG. 17C1 is a schematic sectional view in which small diameter collars of a highly permeable material and large diameter collars of a highly permeable material are alternately arranged in the longtudinal direction;

FIG. 18 is a schematic diagram showing the internal magnetic field distribution on the axis of a superconductor cylinder when the collars of a highly permeable material are disposed respectively as shown in FIGS. 17A, 17B and 17C;

BEST MODE FOR CARRYING OUT THE INVENTION

[Embodiment 1: Effect of an Outer Diameter of the Collar]

FIG. 3 is a schematic sectional view in which collars of a highly permeable material are disposed having an outer diameter D, which is selected, and the highly permeable collar FM is disposed on each side in a position at 80 mm from the center of a double open end type superconductor cylinder SC composed of a bismuth group oxide (BiSrCaCuO) (hereinafter referred to as a superconductor cylinder). The dimensions of the cylinder are 100 mm in inner diameter, 240 mm in length and 5 mm in wall thickness. The dimensions of the collar are 10 mm in length and 0.2 mm in thickness, the permeability is 10000, and the outer diameter D is changed.

A magnetic field distribution on the axis of a superconductor cylinder was measured in applying a uniform lateral magnetic field of 1 (G) to the superconductor cylinder (SC). FIG. 4 is a diagram showing the internal magnetic distribution Hi(Z) on the axis of the cylinder SC when the outer diameter D mm of the highly permeable collar FM is changed. (Hereinafter, in all embodiments, Z denotes the distance from the center of the cylinder SC). In FIG. 4, the ordinate shows t he internal magnetic field Hi and the abscissa shows a distance Z from the center of the cylinder, a line SC protted with a mark ■ expresses an internal magnetic field distribution Hsc(Z) when a single cylinder SC is used without any highly permeable collars FM, a line D20 plotted with a mark □ expresses the case where the outer diameter d=20 mm, a line D30 plotted with a mark ● expresses the case where the outer diameter d=30 mm, a line D40 plotted with a mark x expresses the case where the outer diameter d=40 mm, a line D60 plotted with a mark ○ expresses the case where the outer diameter d=60 mm, and a line D80 plotted with a mark + expresses the case where the outer diameter d=80 mm.

It is seen from FIG. 4 that when the highly permeable collar FM is inserted into the superconductor cylinder SC, a penetrating magnetic field at the center position of the superconductor cylinder SC is lower than that when the superconductor cylinder SC is used alone. The reason is that the longitudinal component of the penetrating magnetic field is absorbed and shorted by the magnetic induction generated in the highly permeable collar FM.

Figure 1:
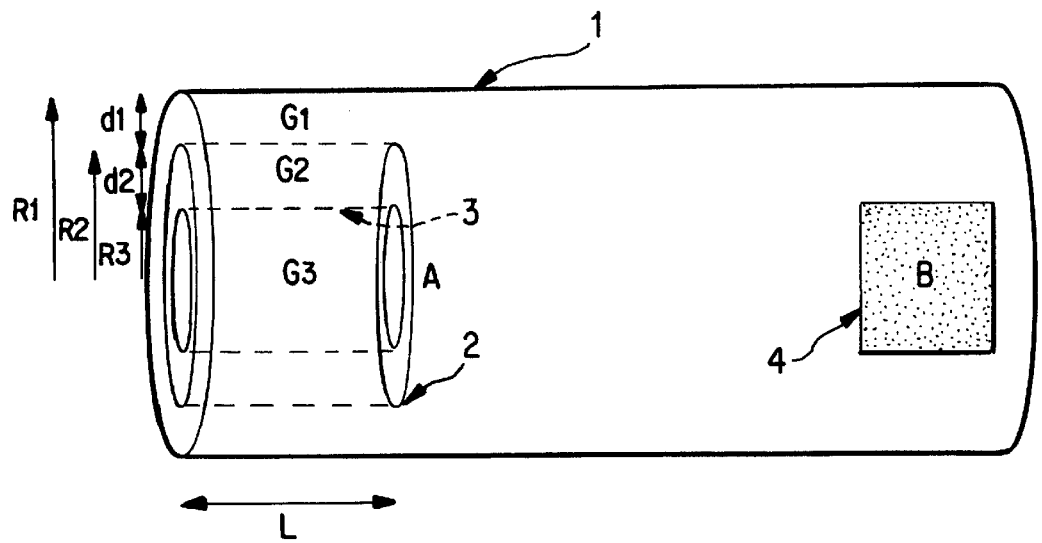
FIG. 1 is an illustrative representation showing the constitution of an embodiment of the present invention.
Figure 2:
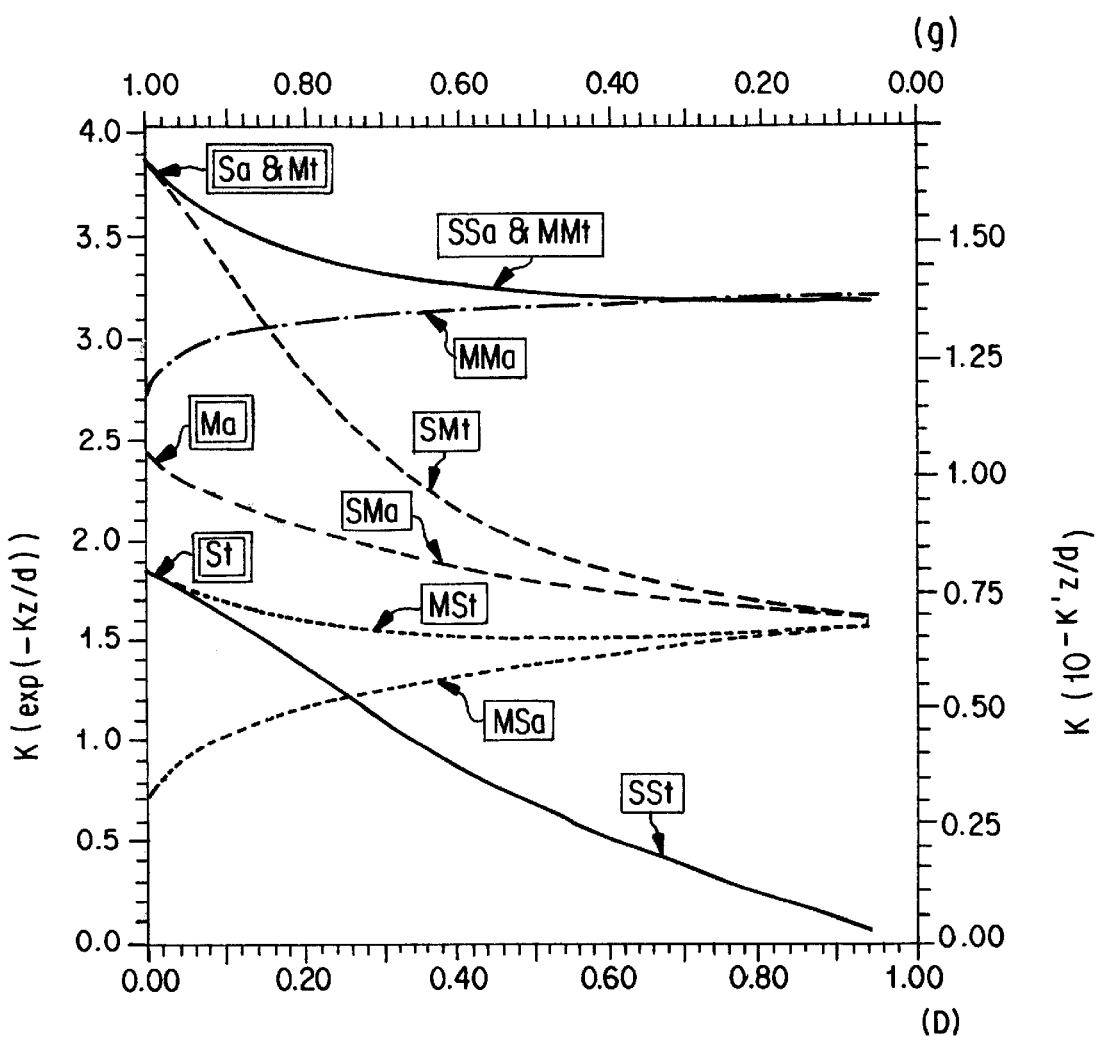
FIG. 2 is a diagram showing the calculation results of attenuation quantities of a magnetic field penetrating into the gaps between various kinds of cylindrical superconductive members and cylindrical ferromagnetic members.
Figure 5:
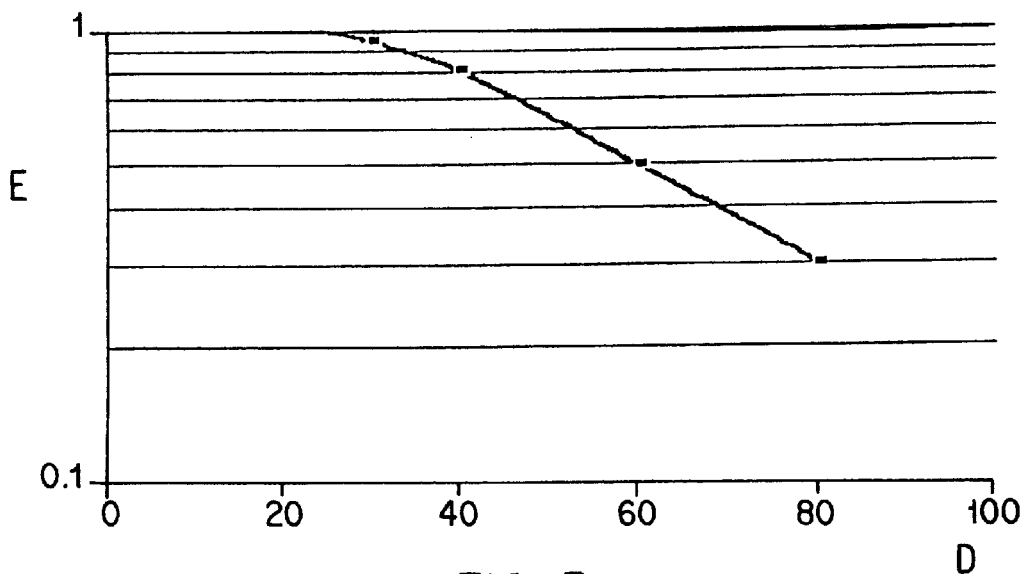
FIG. 5 is a diagram expressing the relation between the outer diameter D of the collar of a highly permeable material and the shielding effect E.

FIG. 5 is a diagram showing the relation between the outer diameter D of the highly permeable collar FM and shielding effect E. The magnetic field distribution Hi(Z), shown in FIG. 4, which is standardized by the magnetic field Hsc(0) at the center position of the cylinder SC, Z=0 is defined as a shielding effect E and, in the diagram. E is expressed in terms of the outer diameter D of the highly permeable collar FM.

The standardization was performed as follows:

$$\text{Shielding effect } E=H_i(0)/H_{sc}(0) \tag{IV}$$

As shown in FIG. 5, it is understood that the shielding effect is improved with the approach of the outer diameter D of the highly permeable collar FM to the inner diameter of the superconductor cylinder. The reason is that more of the longitudinal component of the penetrating magnetic field which increases in the radial direction in the inside of the superconductor cylinder SC is absorbed and shorted by the highly permeable collar FM by making the outer diameter of it larger. In contrast with this, when the outer diameter is 20 mm, the shielding effect is 1. This shows that there is no effect of the highly permeable collar FM. In such a range in the radial direction, the longitudinal component of the penetrating magnetic field is small, so that a magnetically short-circuit effect is almost not obtained.

It was found from the results as described in the above that when the highly permeable collar FM having an outer diameter larger than ⅕ the inner diameter of the superconductor cylinder SC is disposed inside the superconductor cylinder SC, a better shielding effect is obtained than that when a single superconductor cylinder is used alone. It was also found that better shielding effect is obtained with the approach of the outer diameter of the highly permeable collar FM to the inner diameter of the superconductor cylinder SC.

FIG. 6 is a schematic sectional view in which a highly permeable collar FM is disposed in a superconductor cylinder SC of a single open end type. To be concrete, the highly permeable collar FM is disposed at a position at 80 mm from the bottom surface of the superconductor cylinder SC of the single open end type. The dimensions of the cylinder are 100 mm in inner diameter, 120 mm in length and 5 mm in wall thickness. The collar is 10 mm in length and 0.2 mm in thickness, the permeability is 10000, and the outer diameter D is changed. A magnetic field on the cylinder axis at a position 30 mm from the bottom surface was measured in applying a uniform lateral magnetic field of 1 [G] to the superconductor cylinder SC. The shielding effect at Z=30 mm was obtained by equation (IV), and the result almost coincided with the result shown in FIG. 5. It was found that the highly permeable collar FM gave the same shielding effect to both the superconductor cylinder SC of the single open end type and the superconductor cylinder of the double open end type.

Figures 7, 7A:
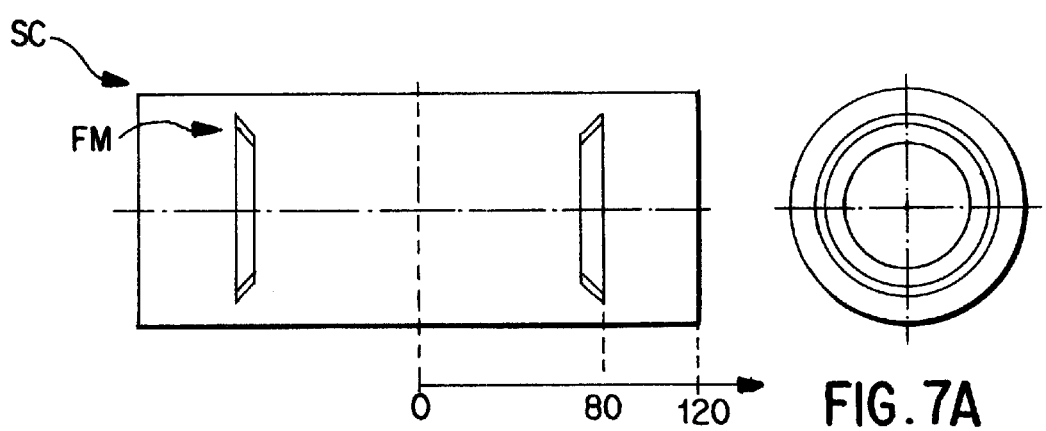
FIG. 7 is a schematic sectional view in which a pair of tapered collars of a highly permeable material is disposed in a superconductor cylinder body of a double open end type.

FIG. 7 is a schematic sectional view in which a tapered collar of a highly permeable material FM is disposed in a superconductor cylinder SC of a double open end type. To be concrete, the highly permeable collar FM is disposed at a position at 80 mm apart from the center of the superconductor cylinder (SC) of the double open end type on each side. The dimensions of the cylinder are 100 mm in inner diameter, 240 mm in length, and 5 mm in wall thickness. Those of the collar are 80 mm in maximum diameter, 60 mm in minimum diameter, 10 mm in height, and 0.2 mm in thickness, and the permeability is 10000. A magnetic field intensity in the center position on the cylinder axis was measured in applying a uniform lateral magnetic field of 1 [G] to the superconductor cylinder SC. In a way similar to the above, according to equation (IV), 0.45 was obtained as the shielding effect at Z=0 mm. From the above-mentioned results, it was found that good shielding effect can be obtained not only in the case of the highly permeable collar FM having the same sized opening ends but also in the case of the tapered highly permeable collar FM in which an opening end has smaller diameter than that of the other opening end.

[Embodiment 2: Effect of Length, in the Central Area]

Figure 8:
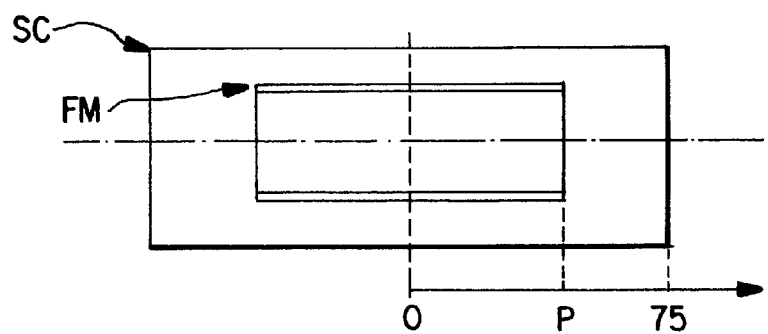
FIG. 8 is a schematic sectional view in which a long collar of a highly permeable material having the length P to be varied is disposed in a superconductor cylinder body.

FIG. 8 is a schematic sectional view in which a long collar of a highly permeable material FM, a length 2P of which is selected, is disposed in a superconductor cylinder SC. In other words, the highly permeable collar having a length of 2P is disposed in the vicinity of the center of the superconductor cylinder of double open end type composed of a bismuth group oxide (BiSrCaCuO). The dimensions of the cylinder are 100 mm in inner diameter, 150 mm in length, and 5 mm in wall thickness. Those of the collar are 75 mm in inner diameter, 2 mm in thickness and 2P mm in length, and the permeability is 10000.

As shown in FIG. 8, an experiment was made in changing the length 2P, in disposing the highly permeable collar FM of a double open end type inside the superconductor cylinder SC so as to cause the axes of both the cylinder and collar coincide with each other. A uniform lateral magnetic field of 1 [G] was applied to this arrangement in the direction perpendicular to the cylinder.

Figure 9:
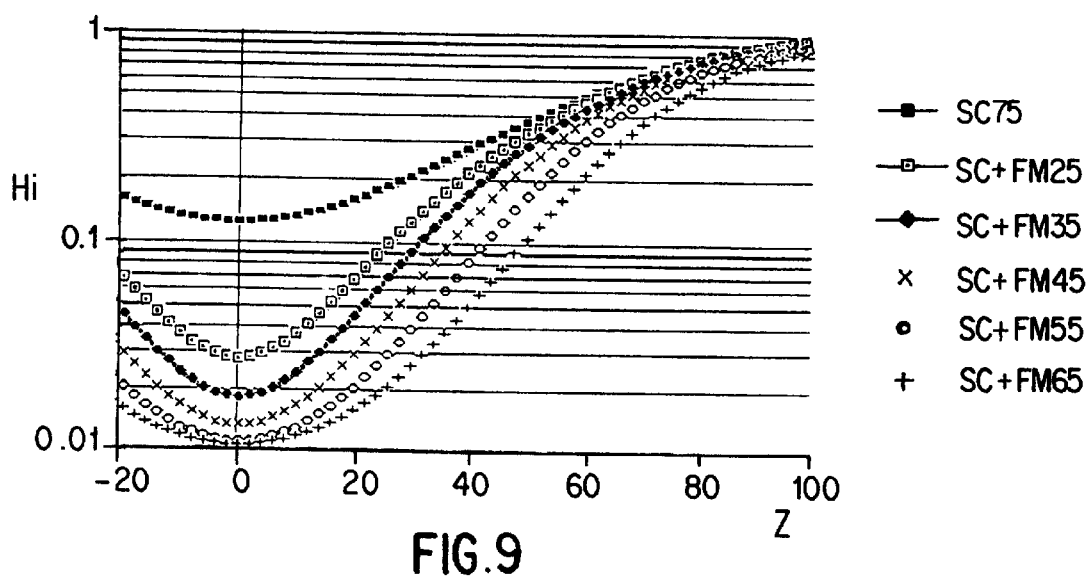
FIG. 9 is a diagram showing an internal magnetic field distribution on the axis of the superconductor cylinder body when the length 2P of the long collar of a highly permeable material is made variable.

FIG. 9 is a diagram showing the internal magnetic field distribution on the axis of the superconductor cylinder SC when the length 2P of the highly permeable collar FM is changed. In FIG. 9, the ordinate shows an internal magnetic field Hi and the abscissa shows the distance Z from the cylinder center. A line SC75 expresses an internal magnetic field distribution when the superconductor cylinder SC is used alone (P=75), and a line SC+FM25 shows an internal magnetic field distribution when the superconductor cylinder SC and the highly permeable collar FM (P=25 mm) are combined.

From this figure it is clearly understood that in a case where the superconductor cylinder SC and the high permeable collar FM are combined, a more feeble magnetic field distribution is shown than when the superconductor cylinder SC is used alone. As the length of the highly permeable collar is lengthened, in particular, the magnetic field intensity at the center position is lowered. At the same time, concerning a shielded space of 0.1 [G], for example, the volume of the shielded space is enlarged as the length of the highly permeable collar FM is lengthened. In the case of the combination with the highly permeable collar FM (P=65 mm), the range of the shielded space of 0.1 [G] is extended up to 50 mm from the center of the cylinder. In order to obtain a similar shielded space with a single superconductor cylinder SC alone, if the cylinder has an inner diameter of 100 mm, a length of 225 mm is required for the cylinder.

Figure 10:
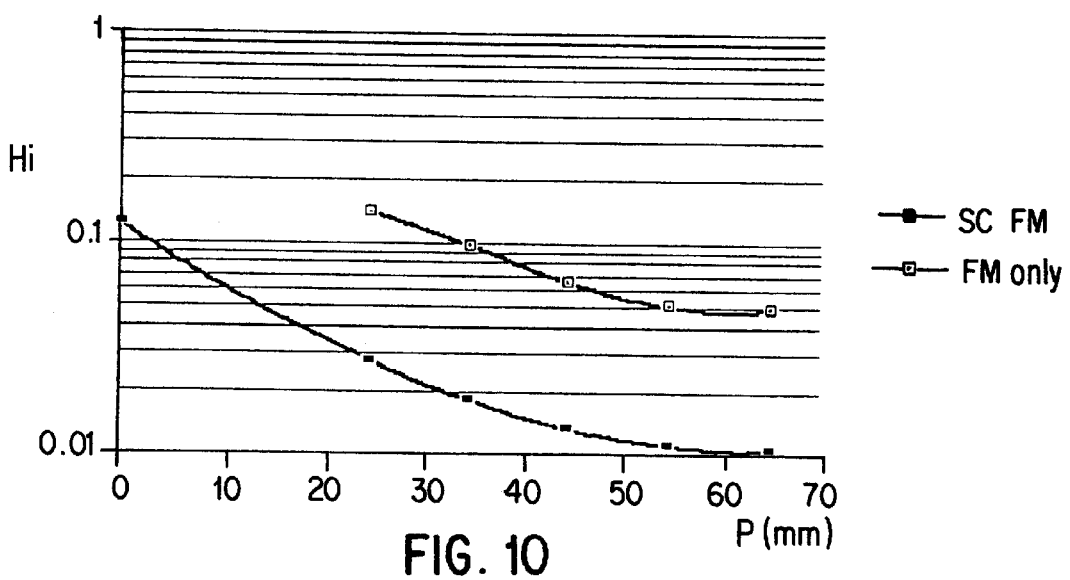
FIG. 10 is a diagram showing the relation between the length 2P of the collar of a highly permeable material and the internal magnetic field.

FIG. 10 is a diagram showing an internal magnetic field Hi when the length of the highly permeable collar is changed variously. In the figure, the ordinate shows an internal magnetic field Hi, and the abscissa shows the length P of the highly permeable collar FM. The internal magnetic field Hi means a magnetic field at the center position of the collar. A line plotted with a mark ■ shows the result of the combination of the superconductor cylinder SC and the highly permeable material FM, and a line plotted with a mark □ shows the result of the case where a single collar FM of the highly permeable material is tested alone.

From FIG. 10, it is understood that when the single collar FM of the highly permeable material (FM) is tested alone, if the length P is longer than 60 mm, the magnetic field at the center position becomes constant.

It is natural that a better shielding effect cannot be obtained with a highly permeable collar FM having only a finite length than that obtained according to equation (III) in which a highly permeable collar having an infinite length is assumed. In a case where the superconductor cylinder SC and the highly permeable collar FM are combined in a similar way to the above, if the length P of the collar FM exceeds 60 mm, the magnetic field at the center position become s constant. Therefore, a shielding effect, when the above cylinder and collar are combined, depends on a shielding effect of the highly permeable collar FM.

From the results described in the above, it is found that in a case where the highly permeable collar FM is disposed inside the superconductor cylinder SC, a feeble magnetic field space is extended wider as the length of the highly permeable collar FM is lengthened.

[Embodiment 3: Effect of Length, Part 2, in the End Portion]

Figure 11:
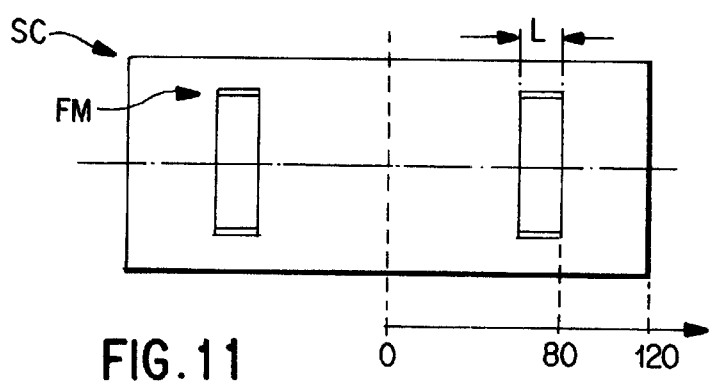
FIG. 11 is a schematic sectional view in which a pair of collars of a highly permeable material, whose length L is to be varied, is disposed in a superconductor cylinder.
Figure 11A:
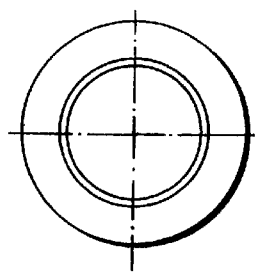

FIG. 11 is a schematic sectional view in which a pair of collars FM of the highly permeable material having several lengths L is disposed in a superconductor cylinder SC. To be concrete, the highly permeable collars FM are disposed at a position 80 mm from the center on each side of the superconductor cylinder SC of a double open end type composed of a bismuth group oxide (BiSrCaCuO) (hereinafter referred to as a superconductor cylinder). The dimensions of the cylinder are 100 mm in inner diameter, 240 mm in length and 5 mm in wall thickness. Those of the collar are 70 mm in outer diameter and 0.2 mm in thickness, and the permeability is 10000, and the length L is changed.

A magnetic field at the center position of the superconductor cylinder SC was measured in applying a uniform lateral magnetic field of 1 [G] to the superconductor cylinder (SC). FIG. 12 is a diagram showing the relation between the length L of the highly permeable collar FM and a shielding effect. In other words, the ordinate shows the shielding effect E shown by the above-mentioned equation (IV) at a position Z=0, and the abscissa shows the length L of the highly permeable collar FM. From the figure, it is understood that a shielding effect is improved more as the length of the highly permeable collar FM is made longer.

It is also found that when the length exceeds 30 mm the shielding effect becomes almost constant, and even though the length is made longer than that a better shielding effect cannot be obtained. The reason why is considered as described below.

When the highly permeable collar FM is disposed in a inclination of the magnetic field inside the superconductor cylinder SC, since the highly permeable material composing the collar has a finite permeability even though the length is made longer than a certain value, it is magnetically saturated and the increase in magnetic induction becomes difficult. The shielding effect, therefore, will show a constant value.

[Embodiment 4: Effect of the Parallel Arangement of the Collars in a Longitudinal Direction]

FIG. 13 is a schematic sectional view in which two pairs of the highly permeable collars FM are arranged parallel in the longitudinal direction of the superconductor cylinder SC on its both sides. In other words, the figure is a schematic sectional view in which the highly permeability collars FM are respectively disposed on each side at the positions 80 mm and 60 mm from the center of the superconductor cylinder SC of a double open end type composed of a bismuth group oxide (BiSrCaCuO) (hereinafterreferred to as a superconductor cylinder). The dimensions of the superconductor cylinder SC are 100 mm in inner diameter, 240 mm in length and 5 mm in wall thickness. Those of the highly permeable collars FM are 10 mm in length and 0.2 mm in thickness, and the permeability is 10000.

A magnetic field distribution on the cylinder axis was measured in applying a uniform lateral magnetic field of 1 [G] to the superconductor cylinder SC. FIG. 14 is a diagram show ing the internal magnetic field distribution Hi(Z) on the axis of the superconductor cylinder SC in which two pairs of the highly permeable collars FM are disposed on both sides. In this figure, the ordinate shows the internal magnetic field Hi and the abscissa shows the distance Z from the center of the superconductor cylinder SC. For the purpose of comparison, there are shown internal magnetic field distributions in the cases where one of the highly permeable collars FM having a length of 10 mm is disposed at a position 80 mm from the center, and the other of the highly permeable collars FM having a length of 30 mm is disposed at a position 80 mm from the center. In FIG. 14, a line SC shows the internal magnetic distribution Hsc(Z) when a single superconductor cylinder is used without any highly permeable collars FM, a line plotted with a mark □ shows the case where L=10 mm, a line plotted with a mark ● shows the case where L=30 mm, and a line plotted with a mark x shows the case where L=10 mm×2 (as shown in FIG. 13).

From FIG. 14, a better shielding effect was obtained when L=30, a longer case than when L=10, and the best shielding effect was obtained when each two collars of L=10 mm are arranged in parallel at an interval on the same position as the collar L=30 mm is positioned. It shows that a better shielding effect can be obtained when the highly permeable collar FM is split into two pieces and they are disposed at an interval than when the length of the collar FM is lengthened. Furthermore, it was found that a shielding effect did not exceed a fixed value even when the length of the collar was made longer as seen in the result of the embodiment 3, however, and when a plurality of short collars FM are disposed in lamination at intervals in the sectional direction, they are not magnetically connected to each other. Accordingly they are not saturated, so that the shielding effect is improved in proportion to the number of colars arranged in parallel.

Therefore, an objective magnetic field can be obtained effectively and also at a low cost when a plurality of the highly permeable collars are disposed in multiple arrangement in the superconductor cylinder SC leaving a space from the inner wall and being formed into a row at intervals in the longitudinal direction.

[Embodiment 5: Effect of the Parallel Arangement of the Collars in a Radial Direction]

FIG. 15 is a sectional view in which two pairs of coaxial collars of a highly permeable material FM are disposed on both sides of a superconductor cylinder SC.

To be concrete, each two collars FM of a highly permeable material having different diameters from each other are disposed in the coaxial manner on each side at a position 80 mm from the center of the superconductor cylinder SC of double open end type composed of a bismuth group oxide (BiSrCaCuO) (hereinafter referred to as a superconductor cylinder). The dimensions of the superconductor cylinder SC are 100 mm in inner diameter, 240 mm in length and 5 mm in wall thickness. Those of the highly permeable collars FM are 10 mm in length and 0.2 mm in thickness, and 80 mm and 60 mm in outer diameters respectively, and the permeability is 10000.

A magnetic field distribution on the cylinder axis was measured in applying a uniform lateral magnetic field of 1 [G] to the superconductor cylinder SC. FIG. 16 is a diagram showing an internal magnetic distribution Hi(Z) on the axis of the superconductor cylinder SC when two collars FM are disposed in multiple layers in the radial direction.

In FIG. 16, the ordinate shows an internal magnetic field Hi and the abscissa shows a distance Z from the center of the superconductor cylinder. For the purpose of comparison, the case where an outer diameter D=80 mm in the embodiment 1 is shown. In the figure, a line SC shows an internal magnetic field distribution Hsc(Z) when a single superconductor cylinder SC is used without any highly permeable collars FM, a line plotted with a mark □ shows the case where D=80, and a line plotted with a mark ● shows the case where D=80 and D=60 respectively (refer to FIG. 15).

As seen in FIG. 16, a better shielding effect was obtained in the case where two collars of a highly permeable material FM are disposed in multiple layers in the radial direction in which D=80 mm and 60 mm than the case where the collar of D=80 mm is disposed. The phenomenon is similar to that in an ordinary shielding method using cylinders of a highly permeable material, and it shows that when the collars are disposed in multiple layers in the radial direction, the shielding effect is improved as well in a inclined magnetic field as in a uniform magnetic field.

As described in the above, an objective magnetic field can be obtained effectively and at a low cost as in the case of the embodiment 4 in disposing the highly permeable collar FM in parallelarrangement in the radial direction.

[Embodiment 6: Effect of the Parallel Arangement of the Collars in a Longitudinal Direction and a Radial Direction]

FIGS. 17A, 17B and 17C are schematic sectional views in which a plurality of highly permeable collars FM are arranged in prallel in both the radial direction and the longitudinal direction. FIG. 17A shows a schematic sectional view of a construction in which a pair of sets of two collars are composed of a parallel arrangement in radial direction. FIG. 17B shows a schematic sectional view of a constitution in which three pairs of sets of two short collars are composed of a parallel arrangement in radial direction and the three sets are disposed in a row in the longitudinal direction. FIG. 17C is a schematic sectional view in which small diameter collars and large diameter collars are alternately disposed in lamination. In other words, the collars having shapes as shown FIGS. 17A to 17C are disposed inside a superconductor cylinder SC of double open end type composed of a bismuth group oxide (BiSrCaCuO) (hereinafter referred to as a superconductor cylinder). The dimensions of the superconductor cylinder SC are 100 mm in inner diameter, 240 mm in length and 5 mm in wall thickness. The permeability of all collars FM is 10000.

To be concrete, a magnetic field distribution on the cylinder axis was measured in applying a uniform lateral magnetic field of 1 [G] to the superconductor cylinder SC. FIG. 17A shows a constitution in which a larger collar FM1 having an outer diameter of 80 mm and a length of 50 mm and a smaller collar FM2 having an outer diameter of 60 mm and a length of 50 mm are disposed in parallel arrangement in the radial direction. FIG. 17B shows a constitution in which three sets of short collars each composed of a larger collar FM1 having an outer diameter of 80 mm and a length of 10 mm and a smaller collar FM2 having an outer diameter of 60 mm and a length of 10 mm, which are arranged in multiple layers in the radial direction, are disposed in a row at intervals in the longitudinal direction. The space occupied by the collars is made equal to that shown in FIG. 17A. FIG. 17C shows a constitution in which the collars composed of a larger collar FM1 having an outer diameter of 80 mm and a length of 10 mm and smaller collar FM2 having an outer diameter of 60 mm and a length of 10 mm, are alternately disposed in a staggered row in the longitudinal direction.

FIG. 18 is a diagram showing the internal magnetic field distribution Hi(Z) on the axis of the superconductor cylinder SC when respective collars FM shown in FIGS. 17A, 17B and 17C are disposed. In FIG. 18, the ordinate shows the internal magnetic field Hi and the abscissa shows the distance Z from the center of the superconductor cylinder SC. A line SC shows the internal magnetic field distribution Hsc(Z) when a single superconductor cylinder SC is used without any of the collars FM, a line plotted with a mark □ shows what is shown in FIG. 17A, a line plotted with a mark ● shows what is shown in FIG. 17B, and a line plotted with a mark x shows what is shown in FIG. 17C.

As clearly shown in the figure, it is understood that in any case a penetrating magnetic field is magnetically shorted by the highly permeable collars FM and the penetrating magnetic field is lower than that in the case where a single superconductor cylinder SC is used alone. In comparing FIG. 17A and FIG. 17B, it is found that a far better shielding effect is shown in the case of FIG. 17B where a plurality of short collars are disposed in multiple layers in the radial direction and in a row in the longitudinal direction even though the spaces occupied by the highly permeable collars FM are the same in both cases.

In the case of FIG. 17A it is anticipated, similar to the result of the embodiment 3, that when there is an inclined magnetic field inside the superconductor cylinder SC, since the permeability of the highly permeable material has a finite value, it is magnetically saturated and, even if the length is lengthened, the shielding effect will not be better than a certain value.

In the case of FIG. 17B, short collars FM are disposed, being laminated at intervals, and respective collars FM are magnetically insulated, so that when the number of laminated collars is increased in the longitudinal direction a better shielding effect can be obtained.

FIG. 17C is an example in which collars having different diameters from each other are alternately arranged in the longitudinal direction. In this case also a better shielding effect can be obtained than that obtained in the example shown in FIG. 17A owing to the arrangement of disposing collars at intervals in a row. In the example, two larger collars FM1 having diameters of 80 mm and three smaller collars FM2 having diameters of 60 mm are used in each pair, and it is easily inferred from the result of the embodiment 1 that when three larger collars having diameters of 80 mm and two smaller collars having diameters of 60 mm are used, a better shielding effect will be able to obtain than that obtained in the above example.

When the single open end type superconductor cylinder SC having half the length of the double open end type superconductor cylinder is used for every model shown in FIGS. 17A, 17B and 17C and the highly permeable collars FM are disposed in the positions at substantially the same distances from an opening end, the similar effect can be obtained as the result obtained in the above examples.

As described in the above, it is made possible to attenuate a penetrating magnetic field effectively and at a low cost, to increase a high-degree magnetically shielded space, and to realize an extremely lower magnetic field than that in the exterior effectively by disposing a plurality of highly permeable collars FM in multiple layers in the radial direction leaving spaces between them and in a row at intervals in the longitudinal direction in the inclined magnetic field inside the superconductor cylinder SC.

[Embodiment 7: Arrangement of a Covering Shield for an Opening Portion of a Superconductor Cylinder]

Figure 19:
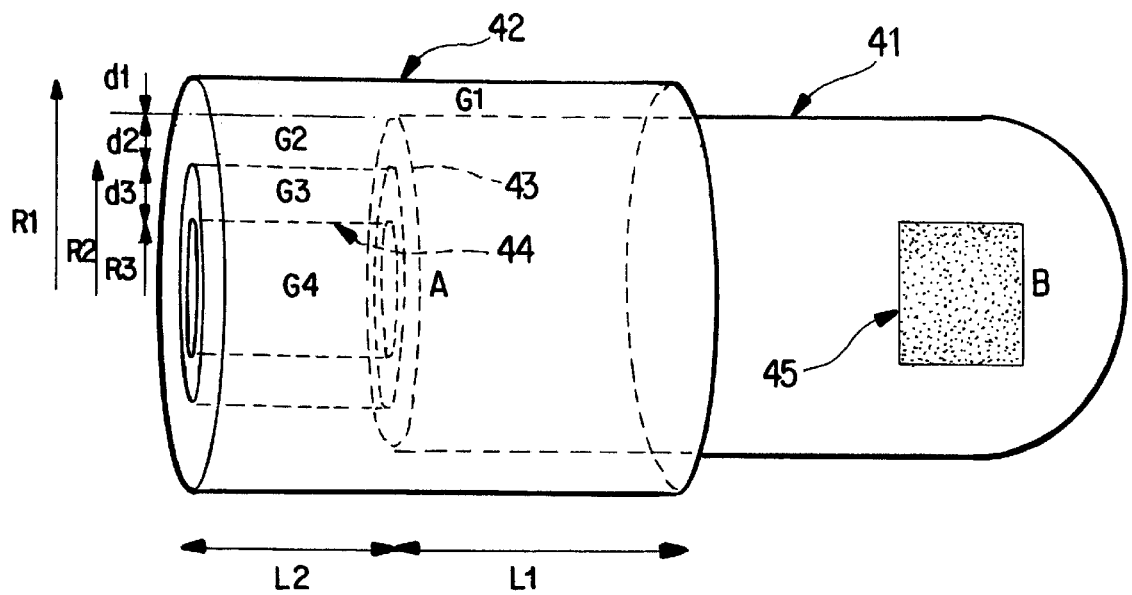
FIG. 19 is an illustrative representation showing a constitution of still another embodiment of the present invention, that is, the constitution in which collars of a highly permeable material are disposed in the vicinity of an end portion of a superconductor cylinder body (inside and outside of the superconductor cylinder)
Figure 20:
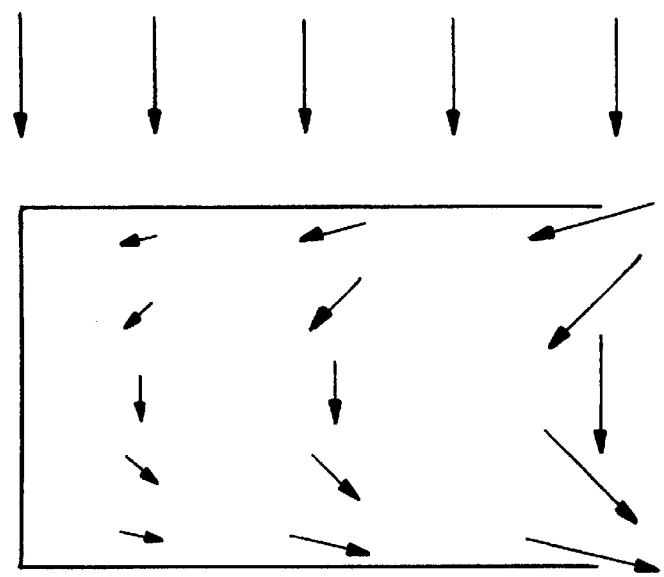
FIG. 20 is an illustrative representation showing a magnetic field distribution when a lateral magnetic field is applied to a superconductor cylinder.

FIG. 19 is an illustrative representation of another embodiment of the present invention. As shown in the figure a additional shield cover system comprises an outer covering body 42 having the length of 150 cm and the inner covering bodies 43 and 44 having the lengths of 80 cm for covering the opening portion of the superconductor cylinder 41 having an inner diameter of a circular sectional portion of 1 m and a length of 2 m, and these covering bodies composed of a ferromagnetic material (Permalloy) of 5 mm thick having diameters of 110 cm, 81 cm and 52 cm are concentrically fitted to the superconductor cylinder.

The magnetic field intensity at point A and point B shown in FIG. 19 was measured. The degrees of magnetic field intensity at both points were $10^{-4}$ and $4 \times 10^{-8}$ times the external magnetic field intensity. On the other hand, a measurement was made removing the additional shield cover system, then it was found that the degrees of magnetic field intensity at A and B points shown in FIG. 19 were respectively $10^{-1}$ and $6 \times 10^{-4}$ times the external magnetic field intensity.

From the above-mentioned results, it is understood that a magnetic field penetrating into the superconductor cylinder SC can be reduced to a remarkably small value by the present invention.

What is claimed is:

1. A magnetically shielding structure comprising:
    a cylindrical shielding body extending along an axis disposed in a longitudinal direction and composed of a superconductive material which manifests a Meissner effect after transition from a normal conductive state to a superconductive state when said cylindrical shielding body is cooled below a predetermined critical temperature, and
    a cylindrical collar means, made of a highly permeable material and having an outer diameter smaller than an inner diameter of said cylindrical shielding body and a through opening oriented in the longitudinal direction along which said axis extends, for absorbing and magnetically shorting a penetrating magnetic field, said cylindrical collar means being displaced relative to said cylindrical shielding body so that a space between said cylindrical shielding body and said cylindrical collar means is provided, said cylindrical collar means comprising a plurality of highly permeable collars arranged coaxially in a multiple layer construction to form a space between each of said collars.

2. A magnetically shielding structure according to claim 1, wherein said cylindrical collar means is disposed inside said cylindrical shielding body.

3. A magnetically shielding structure according to claim 1, wherein said cylindrical collar means is disposed in the vicinity of an opening end of said cylindrical shielding body.

4. A magnetically shielding structure according to claim 1, wherein said cylindrical collar means has a predetermined length.

5. A magnetically shielding structure according to claim 1, wherein said cylindrical collar means comprises a plurality of highly permeable collars arranged in a row in said longitudinal direction so that an interval between said collars is provided.

6. A magnetically shielding structure comprising:

a cylindrical shielding body extending along an axis disposed in a longitudinal direction and composed of a superconductive material which manifests a Meissner effect after transition from a normal conductive state to a superconductive state when said cylindrical shielding body is cooled below a predetermined critical temperature, cylindrical collar means, made of a highly permeable material and having an outer diameter smaller than an inner diameter of said cylindrical shielding body and a through opening oriented in the longitudinal direction along which said axis extends, for absorbing and magnetically shorting a penetrating magnetic field, said cylindrical collar means being disposed outside and in the vicinity of an opening end of said cylindrical shielding body, said cylindrical collar means comprising a plurality of highly permeable collars arranged coaxially in a multiple layer construction to form a space between each of said collars, and cylindrical shielding cover means, made of a highly permeable material and having an inner diameter larger than the outer diameter of said cylindrical shielding body, for coaxially covering over the outer circumference of said cylindrical collar means and of said cylindrical shielding body, said cylindrical shielding cover means being displaced relative to said cylindrical shielding body so that a space between said cylindrical shielding cover means and said cylindrical shielding body is provided.

* * * * *